United States Patent [19]

Watanabe et al.

[11] Patent Number: 4,892,791
[45] Date of Patent: Jan. 9, 1990

[54] BODY COATED WITH CUBIC BORON NITRIDE & METHOD FOR MANUFACTURING THE SAME

[75] Inventors: Kazuhiro Watanabe; Kazuya Saito; Yoshiyuki Yuchi; Konosuke Inagawa, all of Ibaragi, Japan

[73] Assignee: Nihon Sinku Gijutsu Kabushiki Kaisha, Japan

[21] Appl. No.: 173,663

[22] Filed: Mar. 25, 1988

[30] Foreign Application Priority Data

Mar. 27, 1987 [JP] Japan ................... 62-071856

[51] Int. Cl.$^4$ ............ B32P 15/28; B32B 27/14; C04B 41/06
[52] U.S. Cl. ........................ 428/698; 428/700
[58] Field of Search ............ 428/698, 699, 700

[56] References Cited

U.S. PATENT DOCUMENTS 4,731,303  3/1988  Hirano et al. ............ 428/700
4,762,729  8/1988  Hirano et al. ............ 427/38

FOREIGN PATENT DOCUMENTS 0152677  8/1985  Japan .
63-20446  7/1986  Japan .
2109975  5/1987  Japan .
2109976  5/1987  Japan .

*Primary Examiner*—Nancy A. B. Swisher
*Attorney, Agent, or Firm*—Jones, Day, Reavis & Pogue

[57] ABSTRACT

A body coated with cubic boron nitride comprises: a base material; a first interlayer of nitride or boride with which at least one element of IVb group, IIIb group, Vb group, IVa group, Va group and VIa group of the periodic table, in accordance with the quality of the material of the base material is mixed, and the composition ratio of the at least one element is decreased towards the surface, the first interlayer being formed on the base material; and/or a second interlayer of nitride or boride with which at least one element of IVb group, IIIb group, Vb group, IVa group, Va group and VIa group of the periodic table, in accordance with the quality of the material of the base material is mixed at the total mixing amount 0.01 atomic % to 10 atomic %, and shows an absorption peak at the wave number of 950 cm$^{-1}$ to 1150 cm$^{-1}$ according to the infrared absorption spectrum, the second interlayer being formed on the first interlayer or the base material; and a cubic boron nitride film which shows the maximum absorption peak at the wave number of 950 cm$^{-1}$ to 1150 cm$^{-1}$ according to the infrared absorption spectrum, the cubic boron nitride film being formed on the first interlayer or the second interlayer. Or a body coated with cubic boron nitride comprises: a base material; a first interlayer of nitride or boride which includes at least one element of IVb group, IIIb group, Vb group, IVa group, Va group and VIa group of the periodic table, in accordance with the quality of the material of the base material, the first interlayer being formed on the base material; a second interlayer of nitride or boride with which at least one element of IVb group, IIIb group, Vb group, IVa group, Va group and VIa group of the periodic table, in accordance with the quality of the material of said base material is mixed, and the composition ratio of the at least one element is decreased towards the surface, the second interlayer being formed on the first interlayer; a third interlayer of nitride or boride with which at least one element of IVb group, IIIb group, Vb group, IVa group, Va group and VIa group of the periodic table, in accordance with the quality of the material of the base material is mixed at the total mixing amount of 0.01 atomic % to 10 atomic %, and shows an absorption peak at the wave number of 950 cm$^{-1}$ to 1150 cm$^{-1}$ according to the infrared absorption spectrum, the third interlayer being formed on said second interlayer; and a cubic boron nitride film which shows the maximum absorption peak at the wave number of 950 cm$^{-1}$ to 1150 cm$^{-1}$ according to the infrared absorption spectrum, the cubic boron nitride film being formed on said third interlayer. And a method for manufacturing a body coated with cubic boron nitride comprises the steps: of preparing a base material in a vacuum chamber; of preparing elements of at least one of IVb group, IIIB group, Vb group, IVa group, Va group and VIa group of the periodic table, being able to form a compound with boron and nitrogen, or the compound of the at least one group; of intro- (Abstract continued on next page.)

ducing the elements or compound into the vacuum chamber under the control of the evaporation rate or supply rate of the elements or compound, and concurrently under the control of the evaporation rate of boron; and a forming an interlayer of nitride or boride having a predetermined chemical composition between the base material and a cubic boron nitride film.

7 Claims, 3 Drawing Sheets

BODY COATED WITH CUBIC BORON NITRIDE & METHOD FOR MANUFACTURING THE SAME

BACKGROUND OF THE INVENTION

1. Field of the Invention

This invention relates to a body coated with cubic boron nitride, and a method for manufacturing the same.

2. Description of the Prior Art

Recently a film-making technique has been remarkably developed. Various coating techniques of the cubic boron nitride have been developed for coating a part, a tool or the like which requires corrosion-resistance, Methods disclosed in the Japanese Patent Opening Gazettes Nos. 204370/1986, 47472/1987 and 77454/1987 are given as examples for the coating techniques.

In the method disclosed in the Japanese Patent Opening Gazette No. 204370/1986, prasma abundant in electrons is produced by hollow cathode discharge, and a part of the electrons are attracted towards a reaction gas inlet. Gas is activated, and so reactivity for physical vapour deposition has been improved.

In the method disclosed in the Japanese Patent Opening Gazette No. 47472/1987, a DC or AC bias voltage is applied to a reaction gas introducing nozzle which is called "activation nozzle", so that plasma is produced with high density. Ions are injected to a body to be coated, from the plasma of high density. Radio frequency (rf) bias voltage is applied to the body to be coated. Thus, a cubic boron nitride film is formed on the body.

In the Japanese Patent Opening Gazzette No. 77454/1987, such a method for forming a cubic boron nitride film is disclosed that a DC or AC bias voltage is applied to the activation nozzle to produce a plasma of high density, a rf bias voltage is applied to a body to be coated, and a reaction gas such as Nitrogen gas or hydronitrogen gas and a discharge base gas such as Argon are mixed and introduced into the vacuum chamber through the activation nozzle, or concurrently introduced thereinto.

In both of the above described second method (Japanese Patent Opening Gazette No. 47472/1987) and third method (Japanese Patent Opening Gazette No. 77454/1987), the bias voltage is applied to the gas introducing nozzle so that plasma of high density is produced adjacent to the opened portion of the gas introducing nozzle, while the rf bias voltage is applied to the body to be coated, and ions are injected into the body from the plasma of high density so as to form a cubic boron-nitride film on the body.

Besides the above-described methods, a sputtering method, an ion-beam deposition method and an ion plating method are well known for forming a cubic boron nitride film.

The X-ray diffraction method is used for judging the structure of the film. It was reported that the cubic boron nitride film was judged to be formed by the fact that only one peak was obtained nearly at the diffraction angle $2\theta=43°$ within the range of 20° to 50° as shown in FIG. 1.

However, the structure of the boron nitride film which was judged to be cubic-crystalline by the fact that the maximum peak was obtained nearly at the diffraction angle $2\theta=43°$ according to the X-ray diffraction method, is classified into two kinds according to the infrared absorption spectrum method. One of the two kinds shows the absorption peaks at the wave numbers of about 1400 cm$^{-1}$ and 800 cm$^{-1}$, as shown in FIG. 2. The other of the two kinds shows the absorption peak at the wave number of about 1050 cm$^{-1}$. The Vickers hardness of the film of the latter characteristic is 5000 to 6000 kg/mm$^2$. The base material coated with such a film, which requires high wear resistance and high hardness, can have a further longer life.

Hitherto, the boron nitride films which were judged to be cubic-crystalline by the X-ray diffraction method, show the absorption peaks at the wave numbers of about 1400 cm$^{-1}$ and 800 cm$^{-1}$ according to the measurement of the X-ray absorption spectrum. Their Vickers hardness is 2000 to 4000 kg/cm$^2$. Accordingly, it is considered that they include essentially graphite structure (hexagonal boron nitride). They cannot be judged to be cubic-crystalline from the measurement results of the infrared absorption spectrum.

On the other hand, the boron nitride film formed by the method disclosed in the Japanese Patent Opening Gazette No. 47472/1987 or 77454/1987 was confirmed to be cubic-crystalline both by the X-ray diffraction measurement and infrared absorption spectrum method.

However, the film of a few hundreds Å thick near the surface boundary has graphite structure (h-BN film) which shows the absorption peaks at the wave-numbers of about 1400 cm$^{-1}$ and 800 cm$^{-1}$ according to the infrared absorption spectrum measurement, even in the base material coated with the cubic boron nitride film which shows the absorption peak at the wave number of about 1050 cm$^{-1}$. The surface boundary between the base material and the film is instable to moisture in the atmosphere. Adherence strength between them is essentially low. Accordingly, when the base material coated with such a film is let alone in the atmosphere, it has been found that the film is easily peeled from the base material due to the internal stress of the film.

On the other hand, the boron nitride film containing excess boron (B/N>1) has graphite structure according to the infrared absorption spectrum measurement. However, the film strength can be improved, since B—B bonds exist therein. When such a film containing excess boron is interposed as an interlayer between the cubic boron-nitride film and the base material, the adhering strength of the film can be improved. However, when the thickness of the cubic boron nitride film is increased for a practical use, the peeling occurs at the surface boundary between the boron nitride film containing excess boron, and the cubic boron nitride film. Accordingly, it cannot be practically used.

SUMMARY OF THE INVENTION

Accordingly, it is an object of this invention to provide a body coated with cubic boron nitride film in which the film strength can be improved and so stable in the atmosphere that the adherence strength can be improved, and to provide a method for manufacturing such a body coated with cubic boron nitride film.

In accordance with an aspect of this invention, a body coated with cubic boron nitride comprising: (A) a base material; (B) a first interlayer of nitride or boride with which at least one element of IVb group, IIIb group, Vb group, IVa group, Va group and VIa group of the periodic table, in accordance with the quality of the material of said base material is mixed, and the composition ratio of said at least one element is decreased towards the surface, said first interlayer being formed on said base material; and/or a second interlayer of nitride or boride with which at least one element of IVb group, IIIb group, Vb group, IVa group, Va group and VIa group of the periodic table, in accordance with the quality of the material of said base material is mixed at the total mixing amount of 0.01 atomic % to 10 atomic %, and shows an absorption peak at the wave number of 950 cm$^{-1}$ to 1150 cm$^{-1}$ according to the infrared absorption spectrum, said second interlayer being formed on said first interlayer or said base material; and (C) a cubic boron nitride film which shows the maximum absorption peak at the wave number of 950 cm$^{-1}$ to 1150 cm$^{-1}$ according to the infrared absorption spectrum, said cubic boron nitride film being formed on said first interlayer or said second interlayer.

In accordance with another aspect of this invention, a body coated with cubic boron nitride comprising; (A) a base material, (B) a first interlayer of nitride or boride which contains at least one element of IVb group, IIIb group, Vb group, IVa group, Va group and VIa group of the periodic table, in accordance with the quality of the material of said base material, said first interlayer being formed on said base material; (C) a second interlayer of nitride or boride with which at least one element of IVb group, IIIb group, Vb group, IVa group, Va group and VIa group of the periodic table, in accordance with the quality of the material of said base material is mixed, and the composition ratio of said at least one element is decreased towards the surface, said second interlayer being formed on said first interlayer, (D) a third interlayer of nitride or boride with which at least one element of IVb group, IIIb group, Vb group, IVa group, Va group and VIa group of the periodic table, in accordance with the quality of the material of said base material is mixed at the total mixing amount of 0.01 atomic % to 10 atomic %, and shows an absorption peak at the wave number of 950 cm$^{-1}$ to 1150 cm$^{-1}$ according to the infrared absorption spectrum, said this interlayer being formed on said second interlayer and (E) a cubic boron nitride film which shows the maximum absorption peak at the wave number of 950 cm$^{-1}$ to 1150 cm$^{-1}$ according to the infrared absorption spectrum, said cubic boron nitride film being formed on said third interlayer.

In accordance with a further aspect of this invention, a method for manufacturing a body coated with cubic boron nitride comprising the steps: (A) of preparing a base material in a vacuum chamber, (B) of preparing at least one element of IVb group, IIIb group, Vb group, IVa group, Va group and VIa group of the periodic table, being able to form a compound with boron and nitrogen, or said compound of said at least one element; (C) of introducing said elements or compound into said vacuum chamber under the control of the evaporation rate or supply speed of said elements or compound, and concurrently under the control of the evaporation rate of boron; and (D) of forming an interlayer of nitride or boride having a predetermined chemical composition between said base material and a cubic boron nitride film.

The foregoing and other objects, features, and advantages of the present invention will be more readily understood upon consideration of the following detailed description of the preferred embodiments of the invention, taken in conjunction with the accompanying drawings.

DESCRIPTION OF THE PREFERRED EMBODIMENTS

Figure 1:
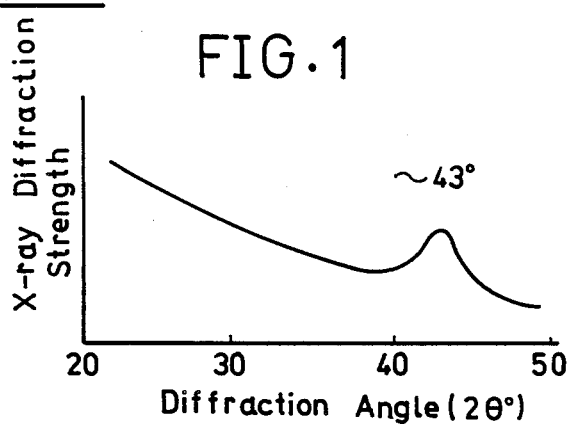
FIG. 1 is graph showing the results of the X-ray diffraction measurement of the boron nitride film produced by the prior method.
Figure 2:
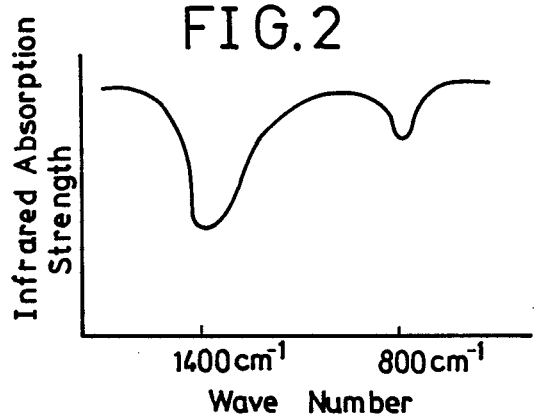
FIG. 2 is a graph showing the results of the infrared absorption spectrum measurement of the boron nitride film produced by the prior method.
Figure 3:
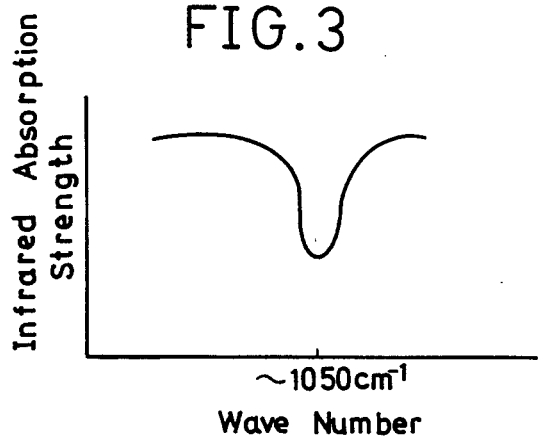
FIG. 3 is a graph showing the infrared absorption spectrum of the cubic boron nitride film.
Figure 4:
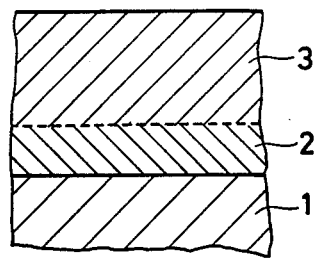
FIG. 4 is an enlarged view of a part of a body coated with cubic boron nitride according to this invention.

FIG. 4 shows the structure of the body coated with cubic boron nitride according to this invention. In FIG. 4, a base material 1 is made of, for example, silicon, WC (tungsten carbide) or $Al_2O_3$. An interlayer 2 which contains at least one element of IVb group, IIIb group, Vb group, IVa group, Va group and VIa group being able to form compounds with boron and nitrogen, is formed on the base material 1. A cubic boron nitride film or layer 3 is formed on the interlayer 2. The interlayer 2 and the cubic boron nitride film 3 are formed by the apparatus shown in FIG. 7 which is partially shown in the Japanese Patent Opening gazette Nos. 47472/1987 and 77454/1987. Next, the apparatus of FIG. 7 will be described. A first evaporation source 12 containing silicon, and a second evaporation source 13 containing boron are arranged in a vacuum chamber 11. Electron beams EB as shown by dash-lines, heat and evaporate silicon and boron in the sources 12 and 13. A partition wall 14 is arranged between the sources 12 and 13. Shutters 21 and 22 are arranged in face to the sources 12 and 13. A substrate or base material 18 to be coated is put directly over the sources 12 and 13. A shutter 20 is arranged under the substrate 18.

A thermal emitter 23 which consists of W(tungsten) filament, is arranged adjacent to the one side wall of the vacuum tank 11. An alternate current source 24 is connected through a transformer 25 to the thermal emitter 23. A rf power source 29 is connected through a matching circuit, which consists of capacitors and an inductance coil, to the substrate 18. A halogen lamp 19 for heating the substrate 18 is arranged above the substrate 18.

An activation nozzle 15 is fixed at the other side wall. Argon gas and nitrogen gas are supplied through a valve 16 into the activation nozzle 15. They are mixed and introduced into the vacuum tank 11 from the activation nozzle 15. Or they are concurrently introduced from the activation nozzle 15. A direct current source 26 is connected to the activation nozzle 15, and it is connected to the transformer 25. An exhausting opening 17 is made at the other side wall, and it is connected to not-shown trap and diffusion pump.

Figure 5:
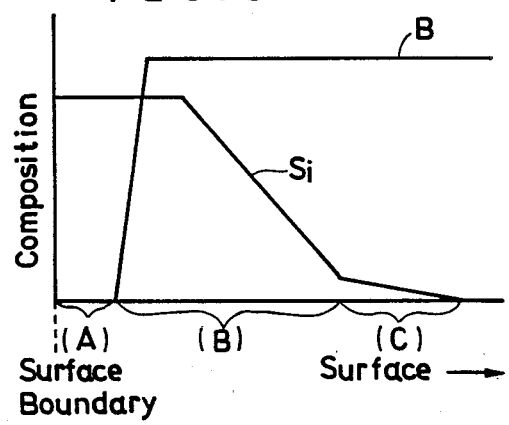
FIG. 5 is a graph showing an example of composition of an interloper according to this invention.

Quartz oscilator thickness monitors 27 and 28 are arranged at both sides of the substrate 18. Evaporation rates of silicon and boron from the sources 12 and 13 are measured by the monitors 27 and 28, respectively. Although not shown, output terminals of the monitors 27 and 28 are connected to the sources 12 and 13. A feedback control is effected for obtaining predetermined evaporation speeds. FIG. 5 shows one example of the interlayer 2 obtained by the apparatus of FIG. 7., in which silicon (Si) is used as an adding element. A layer (A) most adjacent to the base material 1 consists of nitride of $Si_3N_4$, and it is 0.3 $\mu$m thick. The compositions of layers (B) and (C) changes from $Si_3N_4$ to BN through $B_xSi_yN_z$ (as $Si_3N_4 \rightarrow B_xSi_yN_z \rightarrow BN$), where x, y and z represent mixing ratio of elements B, Si and N, respectively. The composition ratios of the adding element (Si) are decreased towards the surface in the interlayers (B) and (C). The decreasing gradient of the layer (C) is smaller than that of the layer (B). The composition of nitrogen (N) is omitted in FIG. 5.

Figure 6:
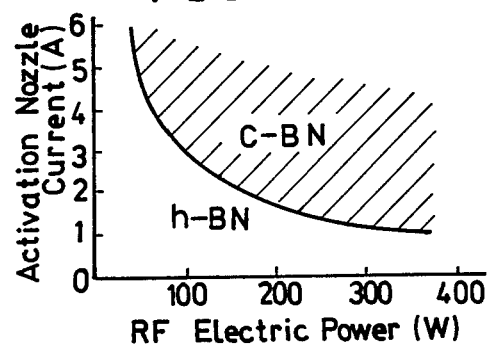
FIG. 6 is a graph for explaining the method of this invention.
Figure 7:
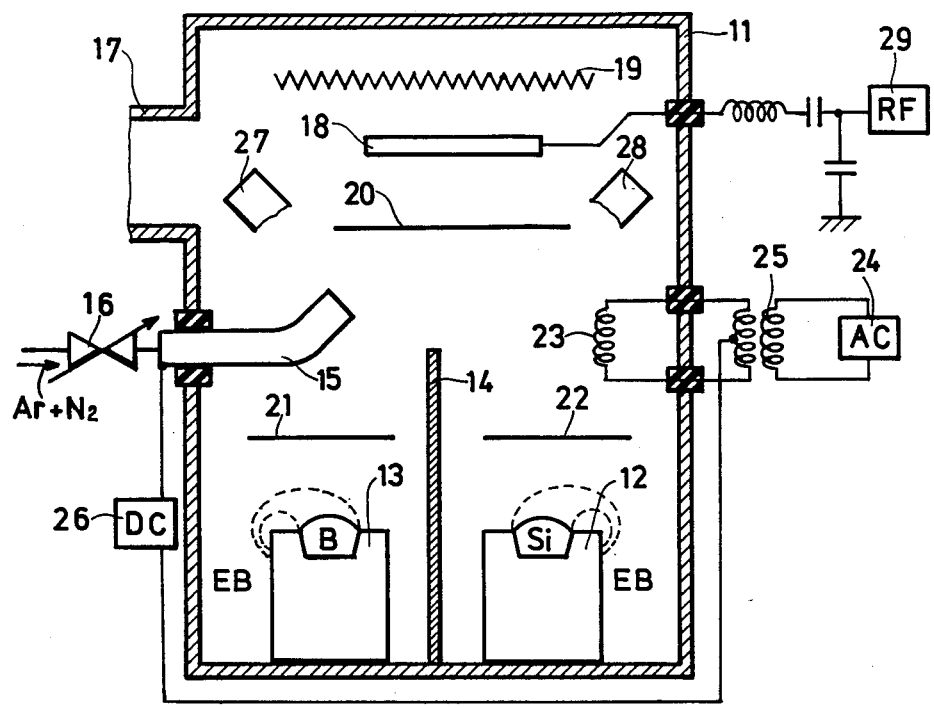
FIG. 7 is a schematic view of an apparatus for forming the film according to this invention.

FIG. 6 shows a parameter region in which the cubic boron film is formed according to this invention in use of the methods disclosed in the Japanese Patent Opening Gazzette Nos. 47472/1987 and 77454/1987, or the apparatus of FIG. 7. As understood from FIG. 6, the cubic boron nitride can be formed in the range over the thresholds of the RF power and activation nozzle current. The RF power is applied as a bias voltage to the base material 1.

Figure 8:
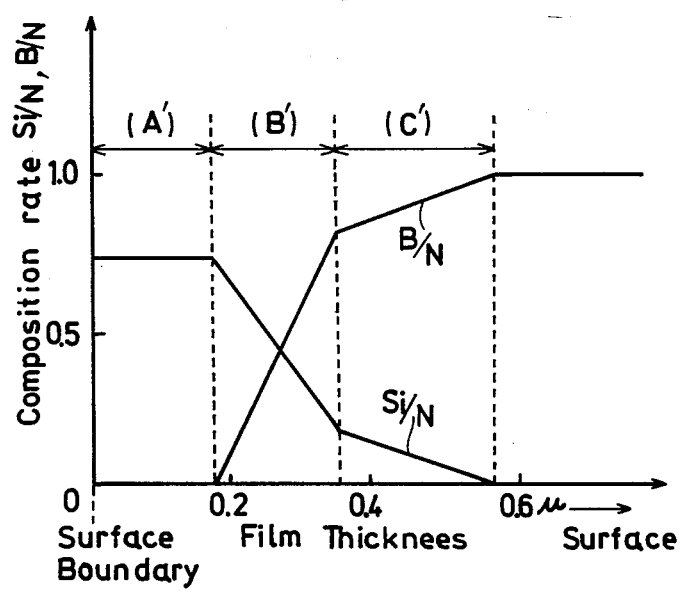
FIG. 8 is a graph showing another example of composition interlayer according to this invention.

FIG. 8 shows another example of the interlayer 2 obtained by the apparatus of FIG. 7 in which silicon (Si) is similarly used as an adding element. In FIG. 8, the evaporation rate of the Si evaporation source is constant in the layer (A') which consists of silicon nitride and is 0.2 $\mu$m thick. For the layer (B'), the heating of the boron evaporation source starts, while the evaporation rate of the Si evaporation source is reduced. The decreasing gradient of Si and the increasing gradient of boron are predetermined in FIG. 8. The layer (B') contains the mixture of silicon nitride and boron nitride, and it is 0.2 $\mu$m thick. In the layer (C'), the decreasing gradient of Si evaporation becomes smaller than in the layer (B'), while the increasing gradient of boron evaporation becomes smaller than in the layer (B').

The table I shows the measurement results on the adherence strengths of the cubic boron nitride (C-BN) films in the atmosphere, in comparison with the prior art method. The cubic boron nitride films are formed through the interlayers 2 on the Si-substrate or WC-Co tip, respectively, at the different thicknesses. The interlayers 2 have the structure shown in FIG. 5.

TABLE I

| Film Construction | C-BN film thick | | |
|---|---|---|---|
| | 0.5 $\mu$m | 1 $\mu$m | 3 $\mu$m |
| C-BN/Interlayer/Si | o | o | o |
| C-BN/Interlayer/WC-Co tip | o | o | o |
| Prior Art | x | x | x |

In the Table I, the mark o represents good adherence, while the mark x represents bad adherence. In the prior art, the films were peeled in a very short time, in the atmosphere. The measurements were made on what element was effective for improving the adherence strength of the film besides silicon, as the adding element. Table II shows the measurement results of the cubic boron nitride films on tee different adding elements. The thickness of the interlayer 2 is constant and 2000 Å, in which the composition ratio of the adding element is decreased from the base material (Si) towards the cubic boron nitride film.

TABLE II

| C-BN film thick | Adding element to Interlayer | | | | | |
|---|---|---|---|---|---|---|
| | Ib group Cu | IIb group Zn | IIIb group Al | IVb group C | IVb group Si | IVb group Ge |
| 0.1 $\mu$m | x | x | o | o | o | o |
| 0.3 $\mu$m | x | x | o | o | o | $\Delta$ |

| C-BN film thick | Adding element to Interlayer | | | | |
|---|---|---|---|---|---|
| | Vb group P | IVa group Ti | Va group Nb | VIa group Cr | VIIIa group Ni |
| 0.1 $\mu$m | o | o | o | o | x |
| 0.3 $\mu$m | $\Delta$ | o | $\Delta$ | $\Delta$ | x |

In the Table II, the mark o represents good adherence, the mark $\Delta$ considerable bad adherence and the mark x bad adherence. In the mark $\Delta$, the film is partially peeled in a very short time under the atmosphere. In the mark x, the film is entirely peeled in a very short time under the atmosphere.

It is confirmed from the Table II that the elements of IIIb group, IVb group, Vb group, IVa group, Va group and VIa group of the periodic table are effective for improving the adherence strength of the film.

Table III shows the experimental results of the adherences on the different structures of the interlayers.

TABLE III

| Base material | Si wafer | | | | WC base tip | | | Al$_2$O$_3$ base tip | | | |
|---|---|---|---|---|---|---|---|---|---|---|---|
| Structure of Interlayer | B | C | C/B | C/B/A | B | C/B | C/B/A | B | C/B | C/B/A | C |
| Adherence | $\Delta$ | o | o | o | $\Delta$ | $\Delta$ | o | $\Delta$ | o | o | $\Delta$ |

In the Table III, the meanings of the marks o and $\Delta$ are equal to those in the Table II. The meanings of the layers A, B and C are equal to those of the layers (A), (B) and (C) in FIG. 5, respectively. B and C represent the single layer structure of (B) and (C), respectively. C/B represents that the layer (B) is formed on the base material, and the layer (C) is formed on the layer (B). C/B/A is equal to the structure (A)(B)(C) shown in FIG. 5. The thicknesses of the interlayers A, B and C are 2000 Å, respectively. The thickness of the cubic-crystalline film is 1 $\mu$m. The element Si was used as the adding element.

Generally defined, the interlayer A is equal to the nitride layer or boride layer which contains at least one kind of element of the IVb group, IIIb group, Vb group, IVa group, Va group and VIa group of the periodic table. The interlayer B is equal to the nitride layer or boride layer with which at least one kind of element of the IVb group, IIIb group, Vb group, IVa group, Va group and VIa group of the periodic table, is mixed and in which the composition ratio of said at least one kind of element is decreased from the base material towards the surface. And the interlayer C is equal to the nitride layer or boride layer with which at least one element of the IVb group, IIIb group, Vb group, IVa group, Va group and VIa group of the periodic table, is mixed at the total mixture amount of 0.01 atomic % to 10 atomic %, and which has the absorption peak at the wave number of 950 cm$^{-1}$ to 1150 cm$^{-1}$.

As understood from the table III, the good adherence can be obtained by the suitable selection of the interlayer structure in accordance with the kind of the base material. As above described, according to this invention, at least one element of the IVb group, IIIb group Vb group, IVa group, Va group and VIa group of the periodic table, is added to form the three-dimensional bonds in the graphite structure of the surface boundary. Thus, even when the base material is coated with a thick cubic boron nitride film, this film can resist sufficiently the internal stress, and the adherence can be greatly improved. Accordingly, this invention is very useful for parts or tools which require corrosion-resistance, wear-resistance and high hardness.

While the preferred embodiment has been described, variations thereto will occur to those skilled in the art within the scope of the present inventive concepts which are delineated by the following claims.

What is claimed is:

1. A body coated with cubic boron nitride comprising:
   (A) a base material;
   (B) a first interlayer formed on said base material; and/or a second interlayer formed on said first interlayer or said base material; and
   (C) a cubic boron nitride film formed on said first interlayer or said second interlayer;
   wherein said first interlayer comprises nitride or boride mixed with at least one element of the IVb group, IIIb group, Vb group, IVa group, Va group and VIa group of the periodic table, in accordance with the quality of the material of said base material, said at least one element having a composition ratio which decreases towards the surface between said first interlayer and said second interlayer or said first interlayer and said cubic boron nitride film; said second interlayer comprises nitride or boride mixed with at least one element of the IVb group, IIIb group, Vb group, IVa group, Va group and VIa group of the periodic table, in accordance with the quality of the material of said base material, at a total mixing amount of 0.01 atomic % to 10 atomic %, and shows an absorption peak at the wave number of 950 cm$^{-1}$ to 1150 cm$^{-1}$ according to the infrared absorption spectrum, and said cubic boron nitride film shows a maximum absorption peak at the wave 2. A body according to claim 1, in which said at least one element of said second interlayer has a composition ratio which decreases towards the surface between said second interlayer and said cubic boron nitride film.

3. A body according to claim 2, in which the decreasing gradient of the composition ratio of said at least one element in said first interlayer is larger than that in said second interlayer.

4. A body according to claim 1, in which the ratio of boron elements to nitrogen elements is increased towards the surface between said first interlayer and said second interlayer or between said first interlayer and said cubic boron nitride film in said first interlayer.

5. A body according to claim 4, in which the ratio of boron elements to nitrogen elements is increased towards the surface between said second interlayer and said cubic boron nitride film in said second interlayer.

6. A body according to claim 5, in which the increasing gradient of said ratio in said first interlayer is larger than that in said second interlayer.

7. A body according to claim 1, in which said first and second layers are 0.01 μm to 3 μm thick, respectively.

* * * * *

UNITED STATES PATENT AND TRADEMARK OFFICE
CERTIFICATE OF CORRECTION

PATENT NO. : 4,892,791

DATED : January 9, 1990

INVENTOR(S) : Watanabe et al

It is certified that error appears in the above-identified patent and that said Letters Patent is hereby corrected as shown below:

On The Title Page:

Item [73], the Assignee should be listed as follows:
Nihon Sinku Gijutsu Kabusiki Kaisha In The Abstract:

Item [57], line 54, change "IIIB" to --IIIb--.
         line 62, change "a" to --of--.

Column 1, line 14, after "corrosion-resistance" add --wear-resistance and high hardness.--
Column 1, line 20, change "prasma" to --plasma--.
Column 1, line 34, change "Gazzette" to --Gazette--.
Column 4, line 35, change "gazette" to --Gazette--.
Column 5, line 10, change "changes" to --change--.
Column 5, line 21, change "Gazzette" to --Gazette--.
Column 6, line 3, change "tee" to --the--.

UNITED STATES PATENT AND TRADEMARK OFFICE
CERTIFICATE OF CORRECTION

PATENT NO. : 4,892,791

DATED : January 9, 1990

INVENTOR(S) : Watanabe et al

It is certified that error appears in the above-identified patent and that said Letters Patent is hereby corrected as shown below:

In The Claims:

Column 8, line 12, after "wave" add --number of 950 $cm^{-1}$ to 1150 $cm^{-1}$ according to the infrared absorption spectrum.--

Signed and Sealed this

Twenty-first Day of April, 1992

Attest:

HARRY F. MANBECK, JR.

Attesting Officer

Commissioner of Patents and Trademarks